(12) United States Patent
Lundberg et al.

(10) Patent No.: US 6,247,226 B1
(45) Date of Patent: *Jun. 19, 2001

(54) PICKUP HEAD FOR A COMPONENT ASSEMBLY MACHINE

(75) Inventors: Marten Lundberg, Haesselby; Mikael Bergman, Jaerfaella; Ulf Weibahr, Taeby, all of (SE)

(73) Assignee: Mydata Automation AB, Bromma (SE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/817,239
(22) PCT Filed: Oct. 12, 1995
(86) PCT No.: PCT/SE95/01177
§ 371 Date: Apr. 10, 1997
§ 102(e) Date: Apr. 10, 1997
(87) PCT Pub. No.: WO96/12394
PCT Pub. Date: Apr. 25, 1996

(30) Foreign Application Priority Data

Oct. 12, 1994 (SE) .................................... 9403477

(51) Int. Cl.[7] ............................................... H05K 3/30
(52) U.S. Cl. ............................... 29/740; 29/739; 29/741; 29/743; 29/DIG. 44; 29/832; 29/834; 198/428; 198/432
(58) Field of Search .......................... 29/740, 739, 741, 29/743, DIG. 44, 832, 834; 318/568.1; 280/420; 198/432, 433, 428, 429

(56) References Cited

U.S. PATENT DOCUMENTS 4,951,383 * 8/1990 Amao et al. ................... 29/740 X
5,458,357 * 10/1995 Wohlhuter ........................ 280/420
5,534,761 * 7/1996 Crippa ............................ 318/568.1

FOREIGN PATENT DOCUMENTS 2 100 626   1/1983 (GB).
2 101 013   1/1983 (GB).

OTHER PUBLICATIONS

IBM Technical Disclosure Bulletin, vol. 28, No. 11, Apr. 1986, pp. 4764–4765, "Chip Transfer Head With Programmable Probe Centerlines".

(List continued on next page.)

Primary Examiner—Lee Young
Assistant Examiner—Rick Kiltae Chang
(74) Attorney, Agent, or Firm—Townsend and Townsend and Crew LLP

(57) ABSTRACT

In a pickup head (1) for an automatic component assembly machine a house (5) is provided, which and a transmission (27, 29) is movable in a vertical direction (z-direction) by means of a drive motor (25) and is arranged on a horizontally (x-direction) movable wagon (3). The house (5) carries several pickup devices (11), which are movably mounted in the house and during the movement of the house (5) can be made to selectively accompany this in order to pick components. Therefor, the pickup devices (11) are resiliently biassed to a pulled down position by compression springs (21) and they can further be locked in an upper position by activating solenoids (31). These have locking pins (37), which during activation engage abutments (23) of each pickup device (11). The pickup head (1) can hereby, by driven by a single motor (25) simultaneously pick several components, what gives a quick picking function and hereby a quicker mounting. Further, when mounting of a component, a pickup device can be turned to a desired angular position by activating another drive motor (39). Around the driving wheel (41) thereof runs a toothed belt (43), which simultaneously engages toothed wheels (45) slidable on the pickup devices (11). In this manner an angular adjustment is obtained by means of a single drive motor (39) acting on all the pickup devices (11).

16 Claims, 2 Drawing Sheets

OTHER PUBLICATIONS

IBM Technical Disclosure Bulletin, vol. 17, No. 7, Dec. 1974, pp. 1876–1877, Call et al "Electronic Component Assembly Apparatus".

IBM Technical Disclosure Bulletin, vol. 22, No. 7, Dec. 1979, pp. 2757–2761, Hoebener: "Multiple Size Chip Pickup, Orientation and Placement Station".

* cited by examiner

PICKUP HEAD FOR A COMPONENT ASSEMBLY MACHINE

TECHNICAL FIELD

The present invention relates to a pickup head for a component assembly machine, in particular an assembly machine for the automatic mounting of electronic and similar components.

BACKGROUND OF THE INVENTION

Automatic assembly machines for electronic components conventionally have a pickup head, which fetches electronic components from different magazines and mounts them on accurately determined locations on a circuit board. The transport from a magazine requires a certain amount of time. Different suggestions have been made earlier and have also been implemented in present machines in order to reduce this amount of time, which can be troublesome and result in the assembly operation requiring a long time in the case where many components are to be mounted on each circuit board and the pickup head can only transport one component in a movement from a magazine to the board.

In IBM Technical Disclosure Bulletin, vol. 28, No. 11, April 1986, pp. 4764–4765, "Chip Transfer Head with Programmable Probe Centerlines", a chip transfer head is disclosed for transferring multiple chips from one type of device carrier to another type of device carrier. Four vacuum probes are used and their lateral position in relation to each other can be adjusted. Also, one or more of the probes can be retracted by means of miniature air cylinders if all probes are not needed.

In IBM Technical Disclosure Bulletin, vol. 17, No. 7, December 1974, pp. 1876–1877, L. G. Call et al., "Electronic Component Assembly Apparatus", a single multisection ram is disclosed having four independent sections. A selector block's slide is engageable in adjacent ram sections. The selected ram sections can be moved vertically by means of an operating cylinder. The ram sections can only be selected in some limited patterns and are thus not controlled individually.

In IBM Technical Disclosure Bulletin, vol. 22, No. 7, December 1979, pp. 2757–2761, K. G. Hoebener, "Multiple Size Chip Pickup, Orientation and Placement Station", a chip placement station is disclosed having a transfer arm. To fixed locations on the transfer arm probes are attached, two for transfer of chips from delivery stations to orienting stations and one from an orienting station to station holding a substrate. The transfer arm moves the probes as one unit in one horizontal direction and in a vertical direction.

In Swedish Patent Applications SE-A 8203546-0, corresponding to U.S. patent application having Ser. No. 06/271,835, now U.S. Pat. No. 4,450,619, and SE-A 8203511-4, corresponding to U.S. patent application having Ser. No. 06/271,836, now U.S. Pat. No. 4,387,506, both filed Jun. 9, 1981 for H. L. Wright et al. and assigned to USM Corporation, an apparatus is disclosed for mounting components individually selected from magazines. Two pickup devices are movable independently along a front side and a rear side of vertically arranged magazines.

The U.S. Pat. No. 4,951,383 and the European patent application EP-A2 0 373 373, for which convention priority is claimed from the same three Japanese patent applications, disclose an automatic mounting apparatus comprising a pickup head 10 having three or more vertically movable pickup devices 41. each one having a vacuum nozzle 45 (11). The pickup devices comprise vacuum channels for holding the nozzle and the component to be mounted, and are driven vertically (z-direction) by a drive mechanism 43, consisting of a drive motor 67, a ball screw 68, a vertically movable nut 69 and a movable plate 70 connected to the nut and having a number of engagement pins 71. When the motor 67 is activated, the plate 70 is driven vertically (along guides 72), which in turn drives the pickup devices vertically by means of the pins 71 supporting the lower sides of flanges 54 mounted to the pickup devices. The pickup devices are further locked in an upper position by blocking levers 63 which are controlled by solenoids 65 and in a deenergized state thereof are locked, these means then engaging the lower sides of the flanges 54 of the pickup devices. In the energized state, the pickup devices are free to move and will then rest on the support pins 71. The pickup head can then, by being driven by a single motor, individually and selectively control the pickup devices for picking a number of components simultaneously. Furthermore, the pickup devices can be also individually controlled to be turned to a desired angular position by means of individual drive motors 77, that are each coupled to its own pickup device.

The Japanese patent application JP-A 6-37486 discloses an automatic assembly machine comprising a number of pickup devices. In e.g FIG. 14, a pickup head is illustrated comprising at least two pickup devices 14 having vacuum nozzles, which seem to be spring-loaded (41) to a projected, lower position, and locked in an upper position by the operation of locking arms 44, which, however, are not individually operative. A similar machine is disclosed in the Japanese patent application JP-A 4-241499.

The Japanese patent application JP-A 64-2400 discloses a mounting machine comprising a pickup head having a number of spring-loaded (33) pickup devices locked in an upper position by blocking arms 36. One arm at a time can be operated for un-locking a selected pickup head.

The European patent application EP-A1 0 434 156 discloses a pickup head for e.g. an assembly machine comprising a number of pickup devices 3 which are mounted in parallel and can be driven to desired angular positions by means of crank arms 13, a coupling rod 15 and a single drive motor 36. Each pickup device can be driven individually to pick or place a component.

The Japanese patent applications JP-A 6-177 592 and JP-A 6-61692 and the European patent application EP-A1 0 578 136 also disclose assembly machines having pickup devices which in some cases appear to be individually operative.

SUMMARY OF THE INVENTION

It is an object of the invention to provide a pickup head for an automatic component assembly machine, by means of which the mounting times can be reduced.

It is a further object of the invention to provide a pickup head having individual pickup devices, the movements of which can be obtained with few driving motors.

It is a further object of the invention to provide a multi-component pickup head having a low weight and a simple construction, allowing rapid movements of the pickup head.

It is a further object of the invention to provide an automatic component assembly machine, by means of which the total time for mounting components on a circuit board can be considerably reduced.

These objects are achieved by the invention, the characteristics of which are set out in and the scope of which is defined by the appended claims.

In a pickup head for an automatic component assembly machine, a first part or house is provided, which by means of a driving motor and a transmission is movable in a vertical direction and is arranged on a wagon or frame which is movable horizontally, in the preferred case, in one direction. The house carries several pickup devices, which are movably mounted in the house and in a movement of the house can be made to selectively accompany the house in order to pick components. Therefore, the pickup devices are individually resiliently, biassed or urged to a lowered, extended position and further, they can be individually locked in an upper position by activating locking devices. They can be solenoids having locking pins, which at activation of the solenoids, will engage abutments of each pickup device. Thereby, the pickup head can be driven by one single motor to simultaneously pick several components, which provides a quick picking function and thus a faster mounting.

The house has, in an advantageous embodiment, a frame shape comprising an upper portion or upper bar and a lower portion or lower bar, so that the pickup devices are movably or slidably mounted in these two portions. The elastic means acting on the pickup devices can then be mounted between the upper and the lower portions.

Further, when mounting a component, a pickup device can be turned to a desired angular position by activation of another driving motor. From this, a single transmission device extends simultaneously to engagement devices on all pickup devices. The transmission device can comprise an endless element such as a toothed belt, which passes around a drive wheel of the driving motor and cooperates with suitably shaped wheels such as toothed wheels on the pickup devices. In this manner, an angular adjustment is obtained by means of one single driving motor acting on all pickup devices. The engagement devices can be slidable on the pickup devices in order to transmit such a turning movement, only when a pickup device adopts a certain position.

Thus, the two operating motors can be attached to the frame of the head allowing that the weight of the vertically moving parts, the house and the pickup devices, can be kept low.

BRIEF DESCRIPTION OF THE DRAWINGS

FIG. 1 is a front view of a pickup head for an automatic component assembly machine.

FIG. 2 is a sectional view along the line II—II in FIG. 1 and

DETAILED DESCRIPTION OF THE PREFERRED EXEMPLARY EMBODIMENTS

Figures 1, 2:
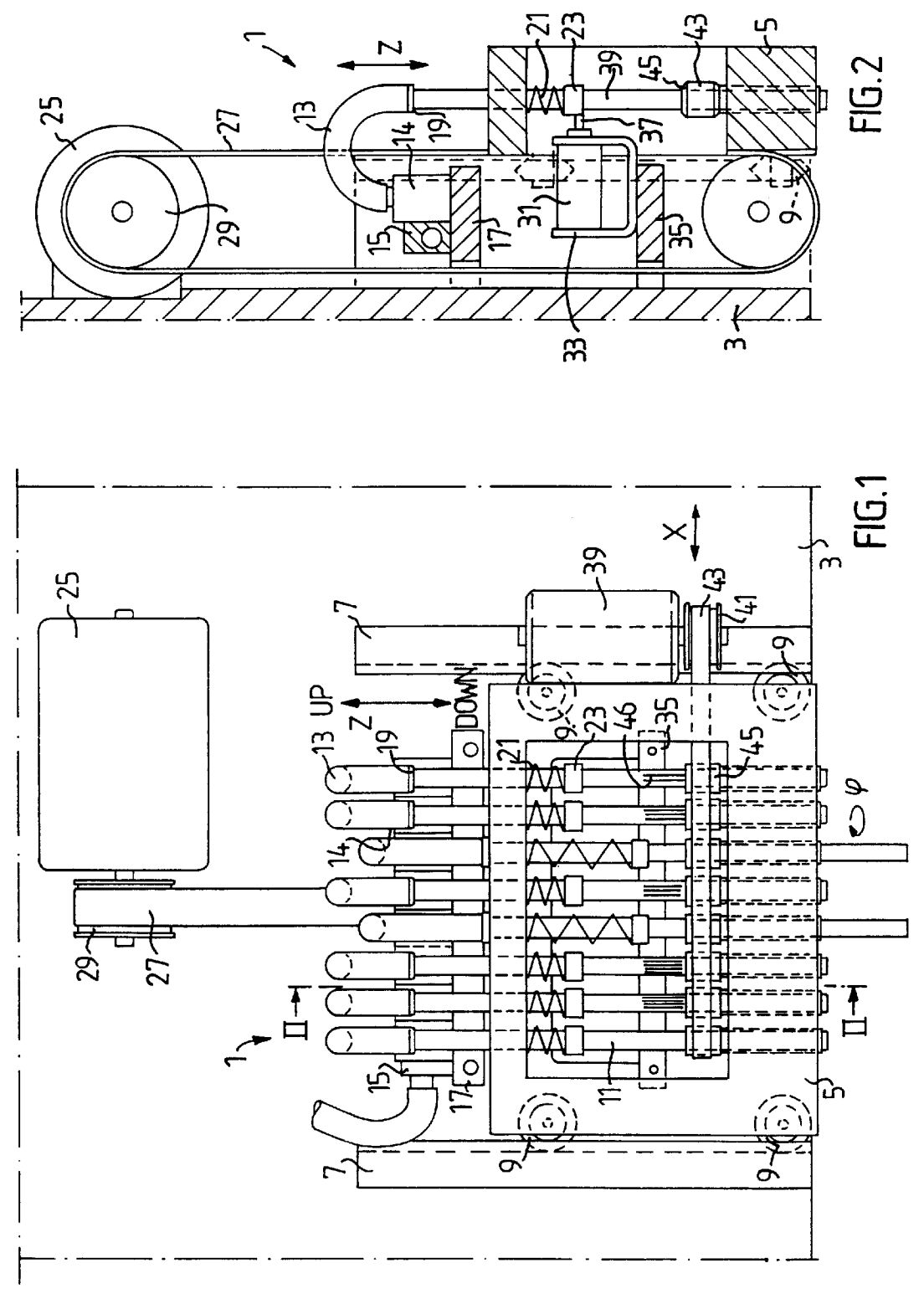
Figure 3:
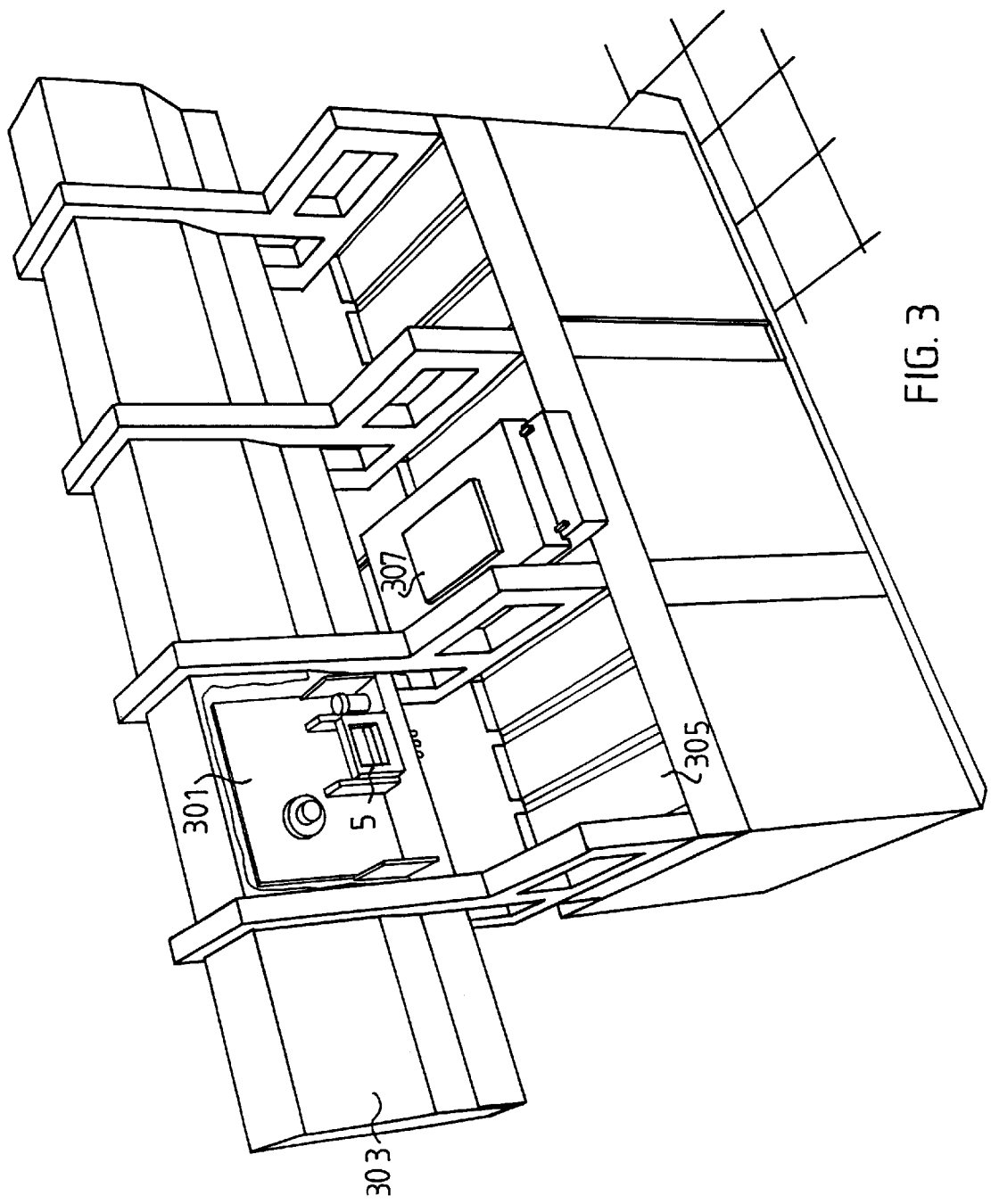
FIG. 3 is a perspective view of a component assembly device.

In FIG. 1, a pickup head or component retaining head 1 is shown attached to the front side of the x-wagon 3 of an automatic assembly machine for electronic components. The x-wagon 3 is movable in a horizontal direction or the x-direction along a guide, seen below. The pickup head 1 comprises a frame shaped house 5, which thus has an upper rod or bar-shaped portion, a rod or bar-shaped lower portion and two rod or bar-shaped side portions, a rectangular opening being formed centrally in the house. The lower frame portion has a larger vertical width than the upper portion. The house 5 is movable in a vertical direction or the z-direction in relation to the wagon 1 and is therefore mounted in linear guides 7 attached to the x-wagon on both sides of the head 5. The guides 7 cooperate with guide wheels 9 rotatably attached to the side portions of the house 5.

In the house 5, several, at most sixteen, or as in the case shown, eight pickup devices or pipettes 11 are provided. They consist of tubular parts, which each, through controllable valves 14, at their upper ends through hoses 13 are connected to a common vacuum conduit 15, the valves and conduit being arranged on a support 17 attached to the x-wagon 3. The pickup devices 11 are movable in the z-direction or vertical direction in relation to the house 5 by being mounted in coaxial bores in the lower and upper bar of the frame-shaped house 5. Further, they are resiliently biassed, to lower, pressed down positions, so that they rest in these normal, lower positions with abutments 19 engaging the top side of the upper bar of the frame-shaped house 5. In FIG. 1, only the pipettes having the order numbers 4 and 6 as counted from the left hand side are in this normal, pressed-down or protruded position.

The abutments 19 can as shown in the figures arranged as flanges secured to the pickup devices at the upper portion thereof, at the connection of the vacuum hose 13 with the upper portion of the pickup devices 11. The elastic operation is achieved in the embodiment shown by helical compression springs 21 arranged between the underside of the upper bar of the frame-shaped house 5 and an abutment 23 having the shape of a ring or flange secured to the pickup devices 11 at portions thereof located inside the opening in the house 5, between the upper and lower bearings for the pickup devices. Other possible devices for obtaining an elastic operation can comprise suitably applied tension springs, gas or fluid springs, etc. The length of stroke of a spring and hereby its stiffness can be fixed or adjustable, such as, for instance, in the showed embodiment by means of a displacement upwards or downwards of the ring-shaped abutment 23 of the pickup device 11 along the stem thereof, possibly also automatically adjustable by means of suitable devices, not shown.

The house 5 is moved in the z-direction by means of a servo control comprising a servo motor 25 having associated transmission means, in the embodiment shown consisting of a belt 27, for instance, a toothed belt, secured to the house 5 at, for instance its upper and lower frame parts and running over a pulley 29 attached to the shaft of the servo motor 25. The transmission can, of course, also in the conventional way, be implemented by means of gear wheel—gear rack, chain—chain wheel, etc. Another possibility is to use a linear servo motor instead, which then simplifies the transmission.

For each of the pickup devices 11 there is a locking device, which is fixedly mounted to the x-wagon 3 and which in the embodiment shown comprises a solenoid 31. It is secured to a bent part 33, which is attached to a support 35, that in turn is attached to the x-wagon 3. The solenoid 31 operates for different electric excitation a pin 37 on its armature, not shown, so that this pin protrudes differently far from the body of the solenoid. In an extended or advanced position, the pin 37 can thus be applied under an abutment of the pickup device, such as for instance, as in the embodiment shown, beneath the abutment 23 also used for supporting the spring 21. Hence, when the pin 37 is extended and thus the locking device is activated, the vertical movement of the pickup device is prevented in relation to the x-wagon 3. The locking device can also alternatively be implemented as a fluid operated cylinder or the like.

Further, the pickup devices 11 are also mounted so that they are rotatable around their longitudinal axis, i.e. in the φ-direction. They can all be turned at an accurately controlled angle. Thus a servo motor 39 is attached to the house 5 having its drive shaft mounted in a vertical direction. Over a toothed wheel 41 stiffly mounted to the drive shaft runs a toothed belt 43, which cooperates with toothed pulleys or wheels 45 on each of the pickup devices 11. The toothed pulleys 45 have the shape of rather thin sleeves and are displaceable or slidable along a portion of the pickup devices 11 but are rotatably secured thereto by some suitable mechanical connection, comprising splines, wedge devices or the like and schematically indicated at 46. This rotatable stiff connection can alternatively be designed so that it is only effective when the pipettes 11 are in their normal, projected positions, and when they are in their upper positions, the connection can be allowed to be disengaged. In the first embodiment, all of the pickup devices 11 will simultaneously be turned through the same angle independently of their position or order number in the row, and in the other embodiment, only the lowered pickup devices are simultaneously turned at an activation of the associated servo motor 39 arranged for the turning operation.

Instead of a toothed belt, a stiff toothed element such as a gear rack, not shown, can be used for turning the pipettes 11. Such a gear rack must be mounted for a sliding movement in a direction perpendicular to the longitudinal direction of the pipettes 11 and for engagement with a gear of the servo motor 39 and with pulleys 45 having suitable teeth on the pipettes 11.

The function of the pickup head 1 will now be described. The house 5 of the pickup head is in its initial position in a pulled up position, above the position shown in the figures, having all the individual pickup devices 11 in their lowered, projected positions and so high that the locking means of the lock devices, the pins 37, can be moved out to the lock abutments, here the abutments 23, in order to block the downward movement of the pickup devices 11. Suitably chosen lock devices are activated, in the case shown in FIG. 1, the lock devices for all pipettes except those having numbers 4 and 6, and then the house 5 is moved in a downward direction by activation of the servo motor 25 for the movement in the z-direction. Hereby, the activated lock devices will engage their respective pickup device 11, i.e. the protruding locking pins 37 will engage a suitable surface of the abutments 19, for instance their under side, and the pipettes 11, the lock devices of which have been activated, remain in this position. This is possible due to the elastic action of the compression springs 21, which during the continued downward movement of the house 5 will be increasingly compressed.

The pickup devices 11, the locking devices of which have not been activated, are moved downwards together with the house 5 and will in a pulled down position come into engagement with components, not shown, placed in suitable magazines, not shown. Through vacuum action the components are positively sucked to the lower, surfaces of the pipettes 11, which have suitable nozzles, and then the whole house is again moved back and upwards. In a suitable high position, where the locking means of the lock devices can again engage all the pickup devices 11, the x-wagon 3 is then moved to a suitable position in the x-direction above a circuit board. Here, all the lock devices but one are activated for a selected pickup device and the house 5 is again lowered. For all pickup devices 11 but the selected one, their lock devices will be engaged so that they remain in an upper blocked position. The selected pickup device, however, follows the house 5 and the components retained thereby are placed on the circuit board. The valve 14 is operated in order to remove the negative pressure in this pipette, which releases the component, so that it can remain in its obtained position. After this the house 5 is transported to its upper position by activation of the z-servo motor 25 and the above described steps are repeated for all the pipettes 11, which carry a component at their bottom surface. This means that all the locking devices but one are activated in the same manner as above and simultaneously the x-wagon 3 is moved to a new position in the x-direction, the house 5 is moved downwards, etc.

Before the contact between a component retained by a pickup device 11 and the circuit board, the pickup device and thereby the components, can be turned to a suitable angular position by energizing the servo motor 39 for the movement in the φ-direction. The toothed belt 43 is thereby displaced a suitable distance and turns in the first case all the pipettes 11, including those which are locked in their upper position, and in the second case only the protruding, lowered pipette 11, through the engagement between the belt 43 and the outer teeth of the toothed rings 45 and between splines or some wedge device inside the rings 45 and outside the pickup devices 11. This rotational adjustment necessary in order for the component to be placed in a correct position on the circuit board.

In FIG. 3 a component assembly or pick-and-place machine is illustrated in a perspective view showing the general configuration of such a machine. A wagon or pickup head 301 is movable along a horizontal bar 303 to different locations, such as above magazine sites 305 intended to hold component feeders, which are movable in a horizontal direction perpendicular to the guide bar 303 and above a circuit board 307 retained on a slide, also movable in the same direction as the magazine sites 305. The wagon 301 carries the vertically movable house 5.

What is claimed is:

1. A pickup head for an automatic assembly machine for picking and placing components, the pickup head comprising:

a first driving motor attached to a frame of the pickup head;

a first movable part mechanically coupled to the first driving motor to move in a first direction in relation to the frame when the first driving motor is activated, the first movable part having an upper portion and a lower portion, the upper portion comprising upper bearings and the lower portion comprising lower bearings;

at least two pickup devices, each pickup device is mounted in the upper and lower portions of the first part to be linearly movable in relation to the first part in the first direction and each pickup device pick a component;

locking means for each pickup device, each locking means takes one of a locked position and an open position, so that in the locked position of the locking means each pickup device cannot accompany the first part in a movement of the first part and in an open position each pickup device accompanies the first part in the movement of the first part;

individual activation means connected to the locking means for individually activating the locking means to the locked position and to the open position, so that by operating the individual activation means each pickup device accompanies or not accompany the first part in order to move to a pickup location for picking the component; and elastic means supported by the upper portion at the upper bearings for urging each pickup device to move in the first direction.

2. The pickup head of claim 1, wherein each elastic means comprises a spring at a first end engaged of said spring with each pickup device and at a second end of said spring engaged with the upper portion.

3. The pickup head of claim 1, wherein the upper and lower bearings are arranged to allow the pickup devices to be rotated around axes extending in the first direction to a desired angular position, the pickup head further comprising a second driving motor mounted to the frame and mechanically coupled to all of the pickup devices to simultaneously rotate the pickup devices to the desired angular position before a placement of a component.

4. The pickup head of claim 3, further comprising individual engagement means on each pickup device and a transmission element, the transmission element engaged with the second driving motor and with the individual engagement means on each pickup device in order to rotate the pickup devices, the individual engagement means being slidable in relation to the pickup devices in order to always maintain a substantially constant position taken in the first direction in relation to the pickup head.

5. The pickup head of claim 4, wherein the transmission element comprises a toothed belt and the individual engagement means comprise toothed wheels.

6. The pickup head of claim 3, further comprising individual engagement means on each pickup device and an endless transmission element, the endless transmission element engaged with the second driving motor and with the individual engagement means on each pickup device in order to rotate the pickup devices.

7. The pickup head of claim 3, further comprising a toothed stiff transmission element in engagement with a toothed driving wheel of the second driving motor and with individual toothed engagement means on each pickup device for rotating the pickup devices.

8. The pickup head of claim 7, wherein a stiff transmission element comprises a gear rack and the individual engagement means comprise gear wheels.

9. The pickup head of claim 7 wherein the individual engagement means are slidably mounted on each pickup device and are rotationally fixed to each pickup device.

10. A pickup head for an automatic assembly machine for picking and placing components, the pickup head comprising:
   a driving motor attached to a frame of the pickup head;
   an upper portion and a lower portion, the upper portion comprising upper bearings and the lower portion comprising lower bearings;
   at least two pickup devices, each pickup device is mounted in the upper and lower portions of a first part to be rotatable in relation to the frame and each pickup device picks a component and to place each component in a desired position,
   a drive motor secured to the pickup head;
   individual engagement means comprising a pulley; and
   a single endless transmission element driven by the drive motor and in simultaneous engagement with pulleys of all the pickup devices for simultaneously rotating the pulleys of all the pickup devices and thereby the pickup devices to a desired angular position when energizing the drive motor before placing a component.

11. The pickup head of claim 10, wherein the endless element comprises a toothed belt and the pulleys comprise correspondingly toothed wheels.

12. The pickup head of claim 11, wherein each pulley of all the pickup devices is slideably mounted on a pickup device and is rotationally fixed to the pickup devices.

13. The pickup head of claim 12, wherein the pickup devices are movable in a first direction to a first position, each pulley of all the pickup devices arranged to slide along a pickup device during a movement of the upper and lower portions and rotationally fixed to the pickup devices only when the pulley of said individual engagement means is in the first position and free to rotate in other positions of the pickup devices different from the first position.

14. The pickup head of claim 11 wherein the pickup devices are movable in a first direction and each pulley of all the pickup devices is arranged to slide along a pickup device during a movement of the upper and lower portions in the first direction while pickup devices are fixed, each pulley of all the pickup devices maintains a same location in relation to the frame of the pickup head during a second direction along an axis of the pickup devices in relation to the frame of the pickup head.

15. An automatic assembly machine comprising a pickup head for picking up and placing components, the pickup head being movable in at least one direction and comprising pickup devices, which are movable in a direction substantially perpendicular to the at least one direction of the pickup head, the pickup head comprising:
   a first driving motor attached to a frame of the pickup head;
   a first movable part mechanically coupled to the first driving motor to be moved in a first direction in relation to the frame when the first driving motor is activated, the first movable part having an upper portion and a lower portion, the upper portion comprising upper bearings and the lower portion comprising lower bearings;
   at least two pickup devices, each pickup device is mounted in the upper and lower portions of the first part to be linearly movable in relation to the first part in the first direction and each pickup device picks a component,
   locking means for each pickup device, each locking means takes one of a locked position and an open position, so that in the locked position of the locking means the pickup device cannot accompany the first part in a movement of the first part and in an open position each pickup device accompanies the first part in the movement of the first part;
   individual activation means connected to the locking means for individually activating the locking means to the locked position and to the open position, so that by operating the individual activation means each pickup device having the locking means to which the individual activation means is connected or accompanies or not accompany the first part in order to move to a pickup location for picking a component; and
   elastic means supported by the upper portion for urging each pickup device to move in the first direction.

16. An automatic assembly machine comprising a pickup head for picking up and placing components, the pickup head being movable in at least one direction and comprising pickup devices, which are moveable in a direction substantially perpendicular to the at least one movement direction of the pickup head, the pickup head comprising:
   a driving motor attached to a frame of the pickup head;
   an upper portion and a lower portion, the upper portion comprising upper bearings and the lower portion comprising lower bearings;
   at least two pickup devices, each pickup device is mounted in the upper and lower portions of a first part to be rotatable in relation to the frame and each pickup device picks a component and to place a picked component in a desired position, a drive motor secured to the pickup head;

individual engagement means for each pickup device, each individual engagement means comprising a pulley; and a single endless transmission element driven by the drive motor and in simultaneous engagement with pulleys of all the pickup devices for simultaneously rotating the pulleys of all the pickup devices and thereby the pickup devices to a desired angular position when energizing the drive motor before placing a component.

* * * * *